(12) United States Patent
Cheah et al.

(10) Patent No.: US 8,853,692 B1
(45) Date of Patent: Oct. 7, 2014

(54) TEST STRUCTURE AND METHOD FOR BOND PAD QUALITY MONITORING

(75) Inventors: Chin Boon Cheah, Penang (MY); Boon Leng Lim, Penang (MY)

(73) Assignee: Altera Corporation, San Jose, CA (US)

( * ) Notice: Subject to any disclaimer, the term of this patent is extended or adjusted under 35 U.S.C. 154(b) by 678 days.

(21) Appl. No.: 12/625,969

(22) Filed: Nov. 25, 2009

(51) Int. Cl.
*H01L 23/58* (2006.01)

(52) U.S. Cl.
USPC .......................................................... 257/48

(58) Field of Classification Search
USPC .................................... 257/780, 48, E21.523
See application file for complete search history.

(56) References Cited

U.S. PATENT DOCUMENTS

| 6,437,364 | B1 * | 8/2002 | Wu ................................. 257/48 |
| 2005/0245050 | A1 * | 11/2005 | Tsao et al. .................... 438/460 |
| 2006/0065969 | A1 * | 3/2006 | Antol et al. ................... 257/700 |
| 2008/0083992 | A1 * | 4/2008 | Lin et al. ....................... 257/774 |

* cited by examiner

*Primary Examiner* — Vongsavanh Sengdara
(74) *Attorney, Agent, or Firm* — Womble, Carlyle, Sandridge & Rice

(57) ABSTRACT

A test structure for measuring bond pad quality is presented. The test structure includes a metal element that is defined over a dielectric layer. The metal element is then covered by a passivation layer, which has a number of probe points that exposes the top surface of the metal element. In addition, the top surface of the metal element is exposed between a pair of adjacent probe points.

19 Claims, 6 Drawing Sheets

TEST STRUCTURE AND METHOD FOR BOND PAD QUALITY MONITORING

BACKGROUND

Bond pads are used to transmit power and signals to an integrated circuit and should provide the lowest resistance connection possible. For this reason, bond pad integrity control (as measured by surface quality and thickness) is crucial to ensure optimum bond pad performance. The primary sources of bond pad degradation are corrosion and aluminum loss. Corrosion of the bond pads is primarily caused by environmental halide (e.g. fluoride, chloride) contamination and storage humidity. Aluminum loss occurs primarily during the bond pad etch that defines the bond pads, and post bond pad formation cleaning processing. Bond pad degradation manifests itself in various forms, such as non-stick on pad (NSOP) issues that occur when the top surface of the bond pad is corroded by halide or the passivation material covering the top level metallization is insufficiently etched. Bond pad degradation is also seen as delamination of the bond pad during application of a bond wire to a bond pad, otherwise known as wire pull reliability. Wire pull reliability is degraded when there is insufficient aluminum thickness after processing. In addition, the driving force from probe monitoring during sort aluminum loss can also result in aluminum loss.

Manufacturing process/environment abnormalities affecting bond pad integrity may result in NSOP issues during wire bonding, wire pull reliability failure, or even final test failures. The current copper-based interconnect control methodology involves using crude visual inspections to monitor the bond pad integrity during the manufacturing process. Additionally, there is no monitoring of the aluminum bond pad metal sheet resistance in place. Other methods of monitoring bond pad quality such as visual microscope inspections, energy dispersive spectroscopy (EDS) and wire pull reliability testing are sample size limited and are not sufficient to detect corrosion or thickness abnormalities on the bond pads for all wafers/dies.

It is in this context that embodiments of the invention arise.

SUMMARY

The present invention provides a method and apparatus for monitoring the quality of bond pads. It should be appreciated that the present invention can be implemented in numerous ways, including as a method, a system, or a device. Several inventive embodiments of the present invention are described below.

In accordance with one aspect of the invention, a test structure for measuring bond pad quality is detailed. The test structure includes a metal element that is defined over a dielectric layer. The metal element is then covered by a passivation layer, which has a number of probe points that exposes the top surface of the metal element. In addition, the top surface of the metal element is exposed between a pair of adjacent probe points.

In accordance with another aspect of the invention, a method of manufacturing a test structure to monitor bond pad quality is provided. The method begins by depositing a metal element, and then defining a passivation layer over the metal element. The method then defines probe points by etching a number of openings in the passivation layer, and exposes the top surface of the metal element located between a first pair of probe points. The top surface of the metal element between a second pair of probe points remains covered by the passivation layer.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

DETAILED DESCRIPTION

The following embodiments describe an apparatus and method for monitoring bond pad quality. It will be obvious, however, to one skilled in the art, that the present invention may be practiced without some or all of these specific details. In other instances, well known process operations have not been described in detail in order not to unnecessarily obscure the present invention.

The invention provides a method of gauging the bond pad integrity (surface quality and thickness) at selected locations on the wafer during semiconductor fabrication processes. It is well known in the art that the process used to etch the top passivation layer will also etch into the metal bond pad. To ensure the bond pads are fully exposed for wire-bonding, the passivation layer is over-etched, such that some of the pad metal is consumed in the process. The exposed metal undergoes the passivation etch process, environmental exposure, and sort probing. Embodiments described below provide a test structure and method to monitor changes in the exposed metal sheet resistance of the test structure compared to the unexposed metal sheet resistance. Changes in the metal sheet resistance as it undergoes the process flow can be correlated to the amount of pad metal consumed during manufacturing of the wafer. Knowledge about the amount of pad metal consumed can in turn be correlated to the quality the bond pad, including bond pad thickness and the amount of bond pad metal affected by corrosion.

Figure 1:
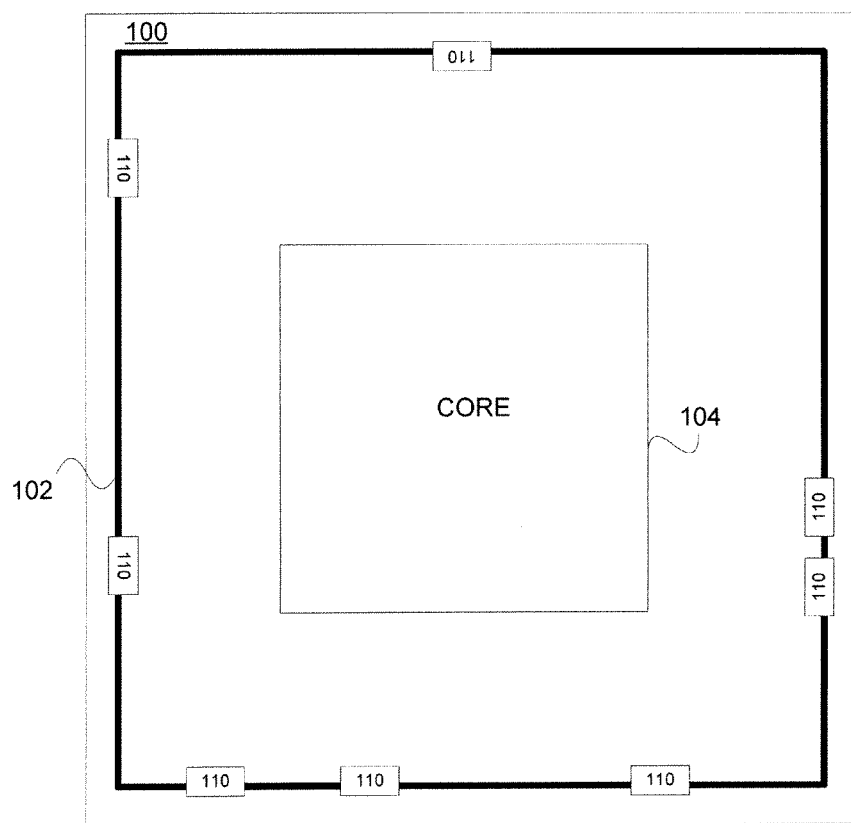
FIG. 1 illustrates a top view of an integrated circuit utilizing a bond pad quality monitoring test structure in accordance with one embodiment of the present invention.

FIG. 1 illustrates a top view of an integrated circuit utilizing a bond pad quality monitoring test structure in accordance with one embodiment of the present invention. In an integrated circuit 100, such as a processor or a programmable logic device (PLD), the input/output (I/O) ring 102 has bonding pads (not shown) which provide input signals and power to the circuits of the core logic 104, as well as transmit output signals from the core logic 104. It is well understood in the art the test structures described below can be applied either as an on-wafer or on-chip process monitoring as the wafer undergoes the complete manufacturing process. In one embodiment, the test structure 110 (not drawn to scale) can be placed in the empty space of the integrated circuit 100 in the I/O ring 102, depending on the amount of empty space on integrated circuit 100. In one embodiment, the test structure 110 can be designed in a serpentine configuration to reduce test structure 110 footprint.

In another embodiment, the test structure 110 can be placed in the scribe line between integrated circuits 100 of semiconductor wafer. Test structures 110 manufactured in the scribe line can be used to monitor the bond pad quality during the bond pad manufacturing process, as well as for on-wafer testing at sort. Test structures 110 located in the scribe line of the wafer can be probed until the integrated circuits 100 are singulated. In a typical semiconductor manufacturing process, the top-level interconnect metallization is covered by a dielectric layer. A bond pad metal layer is deposited on the top of the dielectric layer. Bond pad areas are then defined by etching the bond pad metal. Typically the bond pad metal is aluminum. After formation of the bond pads, a passivation layer is deposited over the bond pads. Access to the bond pad is provided by etching openings into the passivation layer.

Figures 2A, 2B:
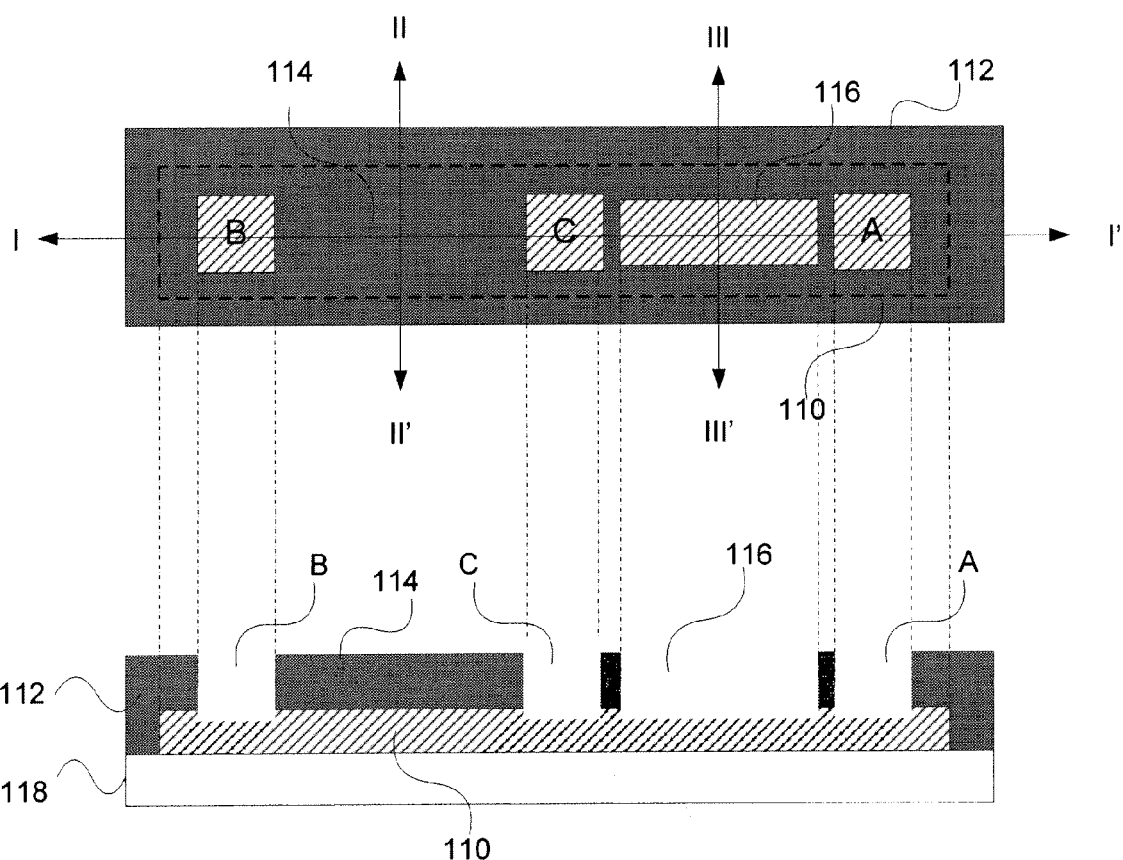
FIG. 2A illustrates a top view of the metal test structure in accordance with one embodiment of the present invention.
FIG. 2B illustrates a lengthwise cross-sectional view of the metal test structure in accordance with one embodiment of the present invention.

FIG. 2A illustrates a top view of the metal test structure in accordance with one embodiment of the present invention. FIG. 2B illustrates a lengthwise cross-sectional view of the unexposed region of the metal test structure in accordance with one embodiment of the present invention. Referring back to FIG. 2A, the cross section of FIG. 2B is taken from the segment of the test structure denoted by points I-I'. In FIG. 2B, the metal element 110 of the test structure is disposed above a dielectric layer 118 and underneath the passivation layer 112. Probe points A, B, and C, enabling access to portions of the metal element 110, are provided by etching openings in the passivation layer 112. The probe points A, B, and C enable access to apply or measure voltages at various locations of the metal element 110. In region 114 located between the pair of probe points B and C, the passivation layer 112 is not etched and the metal element 110 remains protected by the passivation layer 112. In the region between the pair of probe points A and C, an opening 116 in the passivation layer 112 is etched, which in turn, exposes a top surface of the metal element 110.

Figure 2C:
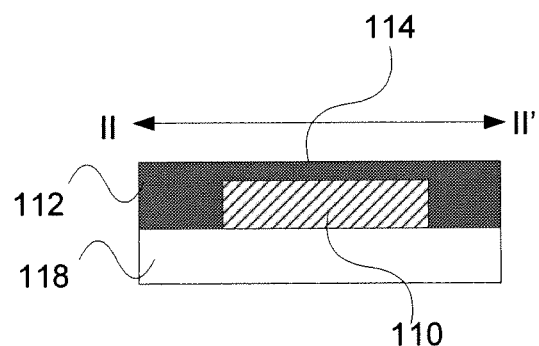
FIG. 2C illustrates a cross-sectional view of the unexposed region of the metal test structure in accordance with one embodiment of the present invention.

FIG. 2C illustrates a cross-sectional view of the unexposed region of the metal test structure in accordance with one embodiment of the present invention. Referring back to FIG. 2A, the cross section of FIG. 2C is taken from the segment of the test structure denoted by points which includes the region 114 with the unexposed portion of the metal element 110. The metal element 110 is deposited above the dielectric layer 118, as discussed in reference to FIG. 2B. Since the metal element 110 is unexposed in this region 114, the sheet resistance of the metal element 110 can be considered as having a fixed sheet resistance.

Figure 2D:
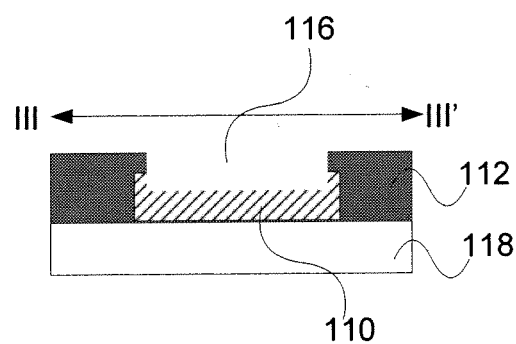
FIG. 2D illustrates a cross-sectional view of the exposed region of the metal test structure, in accordance with one embodiment of the present invention.

FIG. 2D illustrates a cross-sectional view of the exposed region of the metal test structure, in accordance with one embodiment of the present invention. Referring back to FIG. 2A, the cross section of FIG. 2C is taken from the segment of the test structure denoted by points, which includes the opening 116 in the passivation layer 112 that exposes a portion of the metal element 110. As discussed above, the etch that creates the opening 116 in the passivation layer 112 over the metal element 110, also etches an amount of the metal element 110 underneath the opening 116. For this reason, the portion of the metal element 110 exposed by the opening 116 has a different sheet resistance than the portion of the metal element in region 114 that is underneath the passivation layer 112. The sheet resistance of the exposed metal is changed after going through several semiconductor manufacturing and surface treatment processes prior to wire bond/bumping. It is well known in the art that the sheet resistance of a conducting layer is inversely proportional to the thickness of the metal element 110, so that as the thickness of the metal element 110 is changed, the sheet resistance of the metal element 110 changes as well.

Figure 3A:
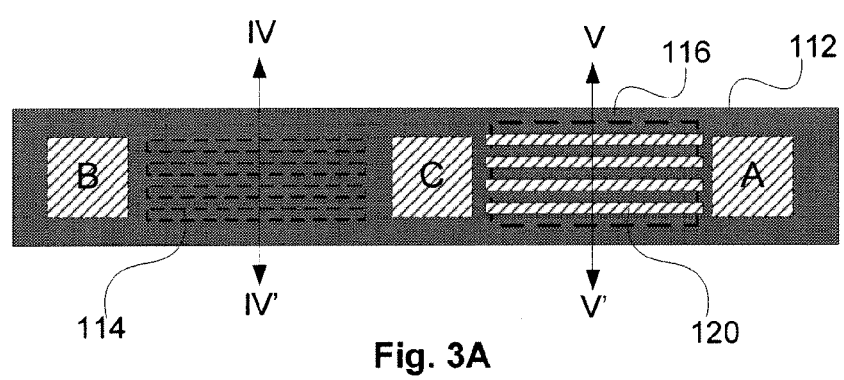
FIG. 3A illustrates a top view of test structure with spaced apart metal sections, in accordance with one embodiment of the present invention.

FIG. 3A illustrates a top view of test structure with spaced apart metal sections, in accordance with one embodiment of the present invention. Corrosion effects on metal elements are difficult to observe over a small surface area. To better measure corrosion effects, the metal element is manufactured as a number of spaced apart metal sections 120. As discussed above, probe points A, B, and C provide access to the metal element at various locations. In region 114 located between a pair of probe points B and C, the spaced apart metal sections 120 remain covered by the passivation layer 112. In the area between the pair of probe points C and A, an opening 116 is etched into the passivation layer 112 over the spaced apart metal sections 120. The opening 116 exposes the spaced apart metal sections 120 to the environment.

Figure 3B:
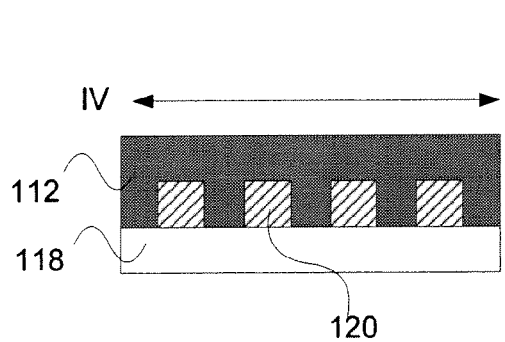
FIG. 3B illustrates a cross-sectional view of the unexposed region of the metal test structure in accordance with one embodiment of the present invention.

FIG. 3B illustrates a cross-sectional view of the unexposed region of the metal test structure in accordance with one embodiment of the present invention. Referring back to FIG. 3A, the cross section of FIG. 3B is taken from the segment of the test structure denoted by points IV-IV', which includes the region 114 with a portion of the metal element underneath the passivation layer 112 and above the dielectric layer 118. The spaced apart metal sections 120 in this region 114 of the test structure are unexposed to the environment. Thus, the sheet resistance of the spaced apart metal sections 120 in this region 114 can be considered to have a fixed sheet resistance.

Figure 3C:
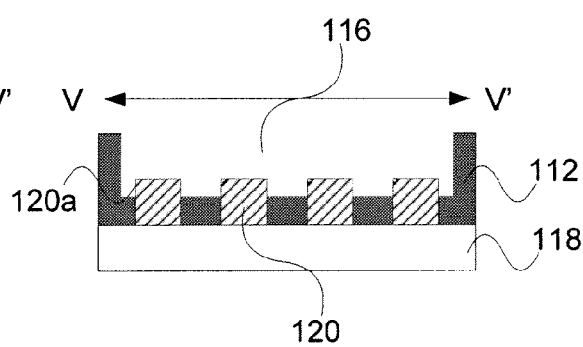
FIG. 3C illustrates a cross-sectional view of the exposed, spaced apart metal sections of the test structure, in accordance with one embodiment of the present invention.

FIG. 3C illustrates a cross-sectional view of the exposed, spaced apart metal sections of the test structure, in accordance with one embodiment of the present invention. Referring back to FIG. 3A, the cross section of FIG. 3C is taken from the segment of the test structure denoted by points V-V', which includes the opening 116 in the passivation layer 112 that exposes an area with spaced apart metal sections 120. As discussed above, the etch that creates the opening 116 in the passivation layer 112 over the spaced apart metal sections 120, also etches an amount of the spaced apart metal sections 120 underneath the opening 116. In addition, the exposed sidewall portions 120a of the spaced apart metal sections 120 increases the surface to area ratio of the test structure. The increased surface of the exposed sidewall portions 120a magnifies the effect of corrosion on the effective thickness of the spaced apart metal segments 120. For these reasons, the spaced apart metal sections 120 that are exposed through the opening 116 has a different sheet resistance the spaced apart metal sections 120 in region 114 that are underneath the passivation layer 112.

Figure 4A:
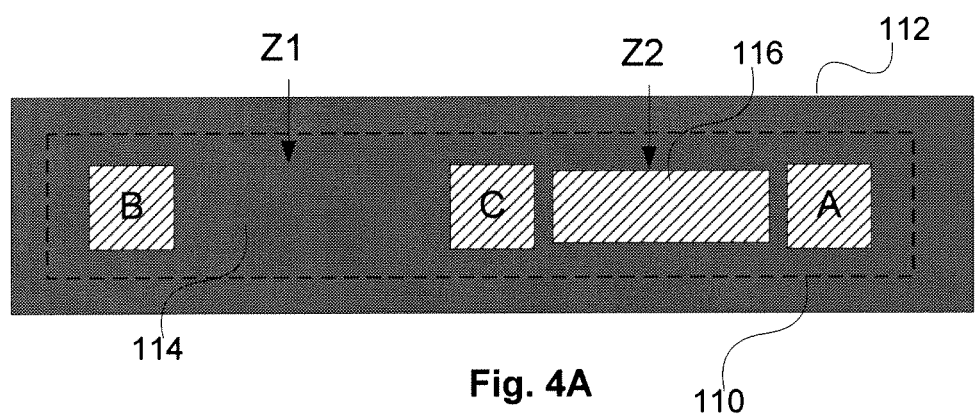
FIGS. 4A and 4B illustrate the top view of the test structure for monitoring bond pad quality and an equivalent circuit of the test structure, in accordance with one embodiment of the present invention.
Figure 4B:
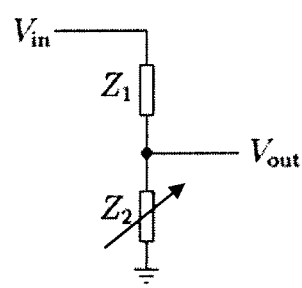

FIGS. 4A and 4B illustrate the top view of the test structure for monitoring bond pad quality and an equivalent circuit of the test structure, in accordance with one embodiment of the present invention. The probe points A, B, and C define a voltage divider in the metal element 110. The region 114 between probe points B and C, where the metal element 110 is disposed underneath the passivation layer 112 can be modeled as a resistor Z1, as seen in FIG. 4B. Similarly, the opening 116 in the passivation layer 112 between probe points A and C can be modeled as a resistor Z2.

The total resistance of a metal element 110 is determined by the resistivity of the metal and the dimensions (i.e. width, length, and thickness) of the metal element 110. In one embodiment, the metal element 110 has a uniform width across the entire length, and probe points A, B, and C are defined in a configuration where the probe points A, B, and C, are defined equidistant from each other. In this case, the resistance of Z2 will be different than the resistance of Z1 due to the difference in the metal thickness at region 114 and at the opening 116. The sheet resistance of the exposed portion of the metal element 110 after etching the passivation layer 112 is effected by having gone through several semiconductor manufacturing and surface treatment processes prior to wire/bump bonding. As discussed above, excessive metal loss due to etching or corrosion from exposure to the environment will reduce the thickness of the metal element 110 and thus translate to a change in resistance.

By appropriate application of power to the probe points of the test structure, the amount of metal loss due to etching or corrosion can be determined. In one embodiment, referring to FIG. 4B, power is applied as an input voltage to the metal element 110 at probe point B, while ground is provided to the metal element 110 at probe point A. The output voltage of the test structure is measured at probe point C. Current flows from probe point B to probe point A horizontally since the dielectric layer on top of which the metal element 110 is defined is an insulator and no current is conducted through the dielectric layer.

By analyzing the test structure as a voltage divider, the output voltage measured at probe point C can be used to correlate the output voltage with the quality of the bond pad. Referring back to FIG. 4B, the output voltage measured at probe point C can be calculated by:

$$V_{out} = \frac{Z_2}{Z_1 + Z_2} V_{IN} \quad (1)$$

Where $V_{IN}$ is the input voltage applied to probe point B and as discussed previously, $Z_1$ and $Z_2$ are the resistances of the metal element 110 in region 114 and the area of the metal element 110 exposed by the opening 116, respectively.

For the case where the width of the metal element 110 is uniform across its entire length, and the probe points are equidistant, the output voltage can be further simplified to be calculated by:

$$V_{out} = \frac{t_1}{t_1 + t_2} V_{IN} \quad (2)$$

Referring back to FIG. 4A, $t_1$ is the thickness of the metal element 110 in the region 114 underneath the passivation layer 112, and $t_2$, is the thickness of the metal element 110 exposed by the opening 116 in the passivation layer 112. Thus, by monitoring the output voltage at probe point C, the amount of metal etched from the metal element 110 can be quantified. In one illustrative example, a 65 mV change in the measured output voltage may correspond to a 0.1 μm metal loss due to etching. The sensitivity of this measurement is exemplary and not meant to be limiting.

Referring back to FIG. 3A, a similar methodology can be used to analyze the output voltage behavior where the metal element uses spaced apart metal sections. This design enhances the sensitivity of the monitoring test structure by exposing the sidewall portion of the spaced apart metal sections, thereby increasing the exposed surface area of the metal element. Excessive metal loss or corrosion at the sidewall portion and top surface of the spaced apart metal sections will reduce the effective thickness of spaced apart metal sections exposed by the opening. Thus, the metal loss and corrosion corresponds to a resistance difference reflected in the measured output voltage at probe point C of the test structure.

The output voltage can be derived in a similar fashion as shown by equations (1) and (2), where the measured output voltage is dependent on the relative cross-sectional areas of the metal element 110 in the region 114 underneath the passivation layer 112, and the cross-sectional area of the metal element 110 exposed by the opening 116 in the passivation layer 112. The effect of corrosion and etching of the sidewall portion may be taken into account in calculating the cross-sectional area of the metal element 110 underneath the passivation layer 112. Assuming the etch is independent of direction and other information about the etch profile of the metal element 110, the measured output voltage can be correlated to the amount of metal etched from the metal element 110 or effected by corrosion. For illustrative purposes, a 105 mV change in the measured output voltage may correspond to a 0.1 μm metal loss due to etching and corrosion. The sensitivity of this measurement is exemplary and not meant to be limiting.

Figure 5:
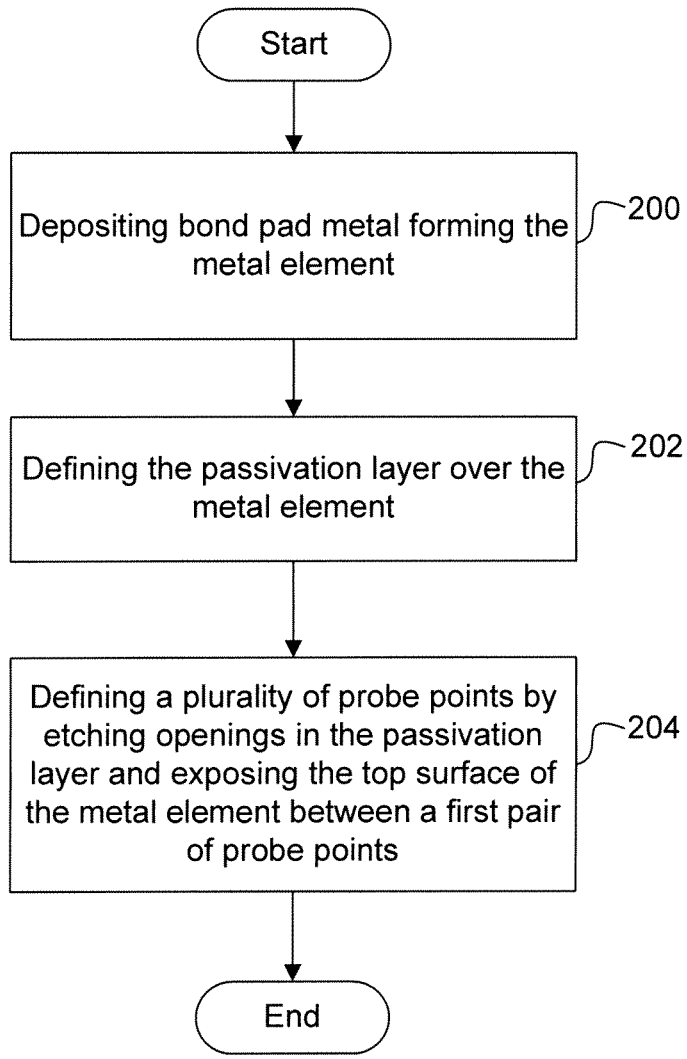
FIG. 5 illustrates the method operations involved in manufacturing a test structure for monitoring bond pad quality, in accordance with one embodiment of the present invention.

FIG. 5 illustrates the method operations involved in manufacturing a test structure for monitoring bond pad quality, in accordance with one embodiment of the present invention. The method initiates with operation 200, where the test structure is manufactured by depositing bond pad metal that forms the metal element. In one embodiment, referring to FIG. 3C, the metal element is defined as a number of spaced apart metal sections. In operation 202, a passivation layer is defined over the metal element. The method proceeds to operation 204, where a plurality of probe points is defined by etching openings in the passivation layer, and the top surface of the metal element between a first pair of probe points. Referring to FIG. 2A, in one embodiment, the test structure has probe points etched in the passivation layer to enable access to the metal element at various locations. An opening that is etched between the first pair of probe points changes the sheet resistance of the metal element in this region, while the top surface of the metal element between the second pair of probe points remains covered.

In one embodiment, referring to FIG. 4A, the opening, located between a pair of adjacent probe points, exposes an area of the metal element having a sheet resistance that is different than the sheet resistance of the metal element underneath the passivation layer. Etching the opening between the first pair of probe points etches an amount of the metal element, which affects the sheet resistance of the metal element exposed by the opening relative to the metal element underneath the passivation layer. In another embodiment, the opening between the first pair of probe points exposes a sidewall portion of the metal element which increases the surface to area ratio of the metal element. The increased surface area increases the amount of metal affected by corrosion and in turn affects the sheet resistance of the metal element exposed by the opening relative to the metal element underneath the passivation layer.

As discussed above, in one embodiment the test structure can be located within the integrated circuit. For integrated circuit designs that have limited space available for placing a test structure, the test structure can be designed in a serpentine configuration to maximize the use of space. After the dies are removed from the wafer, the test structure can be bonded to available bond pads for assembly testing. In addition, after packaging the integrated circuit, the test structure can be tested over an extended time, where the output voltage is periodically measured. The change in the measured output voltage over time can be correlated to effect of corrosion on the bond pad metal as a function of time.

In another embodiment, the test structure can be located in the scribe line of an entire wafer of integrated circuits. Locating the test structure in the scribe line allows for monitoring of bond pad quality in situations where lack of space prevents the test structure from being located on the integrated circuit. In addition, placing the test structure in the scribe line may have the added advantage of allowing bond pad quality measurements to be incorporated into standard electrical testing performed during the wafer manufacturing process. Measurements on the test structure during sort can be used to uncover bond pad quality problems before the wafer is taken to assembly. It should be further appreciated that the test structure described above is used to test and monitor bond pad integrity and the test structure is operated independently from the operation of the integrated circuit. In other words, operation of the test structure is not related to the logic functions performed by the integrated circuit, and the test structure can be operated independently from the integrated circuit.

The method and apparatus described herein may be incorporated into any suitable circuit, including processors and programmable logic devices (PLDs). The PLDs can include programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

The programmable logic device described herein may be part of a data processing system that includes one or more of the following components; a processor; memory; 110 circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the PLDs owned by ALTERA CORPORATION.

The invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The embodiments of the present invention can also be defined as a machine that transforms data from one state to another state. The transformed data can be saved to storage and then manipulated by a processor. The processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A test structure for measuring bond pad quality, comprising:
   a metal element defined over a dielectric layer; and
   a passivation layer disposed over the metal element and
      disposed over a portion of a bond pad metal, the bond pad metal on an uppermost metal layer of a bond pad, the bond pad configured to receive during packaging assembly a bonding component contacting the bond pad metal, the passivation layer having a plurality of openings that expose a top surface of the metal element, the openings including a first opening that provides a first probe point, a second opening that provides a second probe point, a third opening that provides a third probe point, and a fourth opening between the second opening and the third opening, each of the first opening, the second opening and the third opening configured to be probed with a probe contacting the top surface of the metal element during on-wafer testing at sort, with the first probe point, the second probe point and the third probe point defining a voltage divider in the metal element.

2. The test structure of claim 1, wherein the metal element further comprises:
   a plurality of spaced apart metal sections.

3. The test structure of claim 2, wherein the fourth opening exposes a sidewall portion of each of the spaced apart metal sections.

4. The test structure of claim 1, wherein the plurality of openings are defined in a substantially collinear configuration.

5. The test structure of claim 1, wherein the first probe point and the third probe point are equidistant from the second probe point.

6. The test structure of claim 1, wherein a measured sheet resistance of an exposed area of the metal element is different than a measured sheet resistance of an area of the metal element underneath the passivation layer, and the measured sheet resistance of the area of the metal element underneath the passivation layer is a function of an amount of metal etched while exposing the top surface of the metal element.

7. The test structure of claim 1, wherein the test structure is functionally independent of an operation of an integrated circuit.

8. The test structure of claim 1, wherein a thickness of the metal element is substantially equal to a thickness of a metal bond pad.

9. A test structure for measuring bond pad quality, comprising:
   a metal element defined in a bond pad metal layer that is over a dielectric layer, the bond pad metal layer providing an uppermost metal layer of a bond pad, wherein the bond pad is configured to have a bonding component contacting the bond pad metal layer during packaging assembly; and
   a passivation layer disposed over the metal element, the passivation layer having a plurality of openings that expose a top surface of the metal element, the openings including a first opening that provides a first probe point, a second opening that provides a second probe point, a third opening that provides a third probe point, and a fourth opening between the second probe point and the third probe point, with the first probe point, the second probe point and the third probe point defining a voltage divider in the metal element, wherein each of the first opening, the second opening and the third opening is configured to be probed with a probe contacting the top surface of the metal element during on-wafer testing at sort, wherein a measured sheet resistance of an area of the metal element exposed by the fourth opening is different than a measured sheet resistance of an area of the metal element underneath the passivation layer between the first probe point and the second probe point.

10. The test structure of claim 9, wherein the metal element further comprises:
    a plurality of spaced apart metal sections.

11. The test structure of claim 10, wherein the fourth opening exposes a sidewall portion of each of the spaced apart metal sections, the metal sections spaced apart from each other by a portion of the passivation layer.

12. The test structure of claim 9, wherein the plurality of openings are defined in a substantially collinear configuration.

13. The test structure of claim 9, wherein the first opening and the third opening are equidistant from the second opening.

14. A test structure for measuring bond pad quality, comprising:
    a metal element defined over a dielectric layer;
    a passivation layer disposed over the metal element, the passivation layer having a plurality of openings that expose a top surface of the metal element, the openings including a first opening that defines a first probe point, a second opening that defines a second probe point, a third opening that defines a third probe point, and a fourth opening, wherein the first probe point, the second probe point and the third probe point define a voltage divider in the metal element; and
    a plurality of spaced apart metal sections included as a portion of the metal element, wherein the fourth opening exposes a top portion and a sidewall portion of the spaced apart metal sections.

15. The test structure of claim 14, wherein the plurality of openings are defined in a substantially collinear configuration.

16. The test structure of claim 14, wherein the second opening is equidistant from the first opening and the third opening.

17. The test structure of claim 14, wherein a measured sheet resistance of an exposed area of the metal element between the second probe point and the third probe point is different than a measured sheet resistance of an area of the metal element underneath the passivation layer and between the first probe point and the second probe point, and the sheet resistance of the exposed area of the metal element is a function of an amount of metal etched while exposing the top surface of the metal element.

18. The test structure of claim 14, wherein the test structure is functionally independent of an operation of an integrated circuit.

19. The test structure of claim 14, wherein a thickness of the metal element is substantially equal to a thickness of a metal bond pad.

* * * * *